United States Patent
Wu et al.

(10) Patent No.: US 10,924,129 B2
(45) Date of Patent: Feb. 16, 2021

(54) TIME-INTERLEAVED ANALOG-TO-DIGITAL CONVERTER DEVICE AND ASSOCIATED CONTROL METHOD

(71) Applicant: MEDIATEK INC., Hsin-Chu (TW)

(72) Inventors: Su-Hao Wu, Hsin-Chu (TW); Chan-Hsiang Weng, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/830,243

(22) Filed: Mar. 25, 2020

(65) Prior Publication Data

US 2020/0343899 A1    Oct. 29, 2020

Related U.S. Application Data

(60) Provisional application No. 62/839,822, filed on Apr. 29, 2019.

(51) Int. Cl.
    *H03M 1/12* (2006.01)
(52) U.S. Cl.
    CPC .................... *H03M 1/121* (2013.01)
(58) Field of Classification Search
    CPC ..... H03M 1/101; H03M 1/1215; H03M 1/121
    USPC .......................... 341/155, 159, 141, 120, 118
    See application file for complete search history.

(56) References Cited

U.S. PATENT DOCUMENTS

| | | | |
|---|---|---|---|
| 6,392,575 B1 | 5/2002 | Eklund | |
| 9,143,147 B1 | 9/2015 | Ray | |
| 9,294,112 B1 | 3/2016 | Devarajan | |
| 9,793,910 B1 | 10/2017 | Devarajan | |
| 2006/0097901 A1 | 5/2006 | Draxelmayr | |
| 2006/0238454 A1 | 10/2006 | Wang | |
| 2014/0015703 A1* | 1/2014 | Pullela | H03M 1/50 341/166 |
| 2014/0152478 A1* | 6/2014 | Lewis | H03M 1/0673 341/123 |

(Continued)

FOREIGN PATENT DOCUMENTS

| | | |
|---|---|---|
| CN | 109245766 A | 1/2019 |
| TW | 201813318 A | 4/2018 |

OTHER PUBLICATIONS

Siddharth Devarajan ,"A 12b 10GS/s Interleaved Pipeline ADC in 28nm CMOS Technology", 2017 IEEE International Solid-State Circuits Conference.

(Continued)

*Primary Examiner* — Peguy Jean Pierre
(74) *Attorney, Agent, or Firm* — Winston Hsu

(57) ABSTRACT

The present invention provides a time-interleaved analog-to-digital converter device, wherein the time-interleaved analog-to-digital converter device includes a random number generator, a plurality of ADCs and an output circuit. The random number generator is configured to generate a random number sequence. The plurality of ADCs are configured to receive an analog input signal to generate a plurality of digital signals, respectively, and each ADC is further configured to generate a selection signal according to the random number sequence. The output circuit is configured to select one of the digital signals according to the selection signals generated by the ADCs, to generate a digital output signal.

10 Claims, 4 Drawing Sheets

(56) References Cited

U.S. PATENT DOCUMENTS

2015/0381195 A1* 12/2015 Sundblad .............. H03M 1/126
340;341/123

OTHER PUBLICATIONS

"Mixed signal design in nanoscale CMOS technologies—subproject three: research report of Analog-Digital Conversion Techniques in Nanoscale CMOS ICs", report of research project of National Science Council, Nov. 15, 2011. http://www.etop.org.tw/index.php?c=adm11252&m=getReportFile&d=adm&i=114085.

* cited by examiner

TIME-INTERLEAVED ANALOG-TO-DIGITAL CONVERTER DEVICE AND ASSOCIATED CONTROL METHOD

CROSS REFERENCE TO RELATED APPLICATIONS

This application claims the priority of U.S. Provisional Application No. 62/839,822, filed on Apr. 29, 2019, which is included herein by reference in its entirety.

BACKGROUND

In order to make an analog-to-digital converter (ADC) be applied to a high-speed application, a time-interleaved ADC device comprising a plurality of ADCs is developed to increase the overall system sampling rate. Because the ADCs may be mismatched due to the semiconductor process, the digital output signal of the time-interleaved ADC device may have a spur if the ADCs are always sequentially used to generate the digital output signal. In order to solve the spur issue of the digital output signal, the conventional art uses more ACDs and a timing controller to select one of the ADCs to generate the digital output signal. However, this conventional art needs many wires connected between the timing controller and the ADCs, causing the difficulty to the routing within the chip.

SUMMARY

It is therefore an objective of the present invention to provide a time-interleaved analog-to-digital converter device, which has a simpler routing within the chip and capable of solving the spur issue of the digital output signal, to solve the above-mentioned problems.

According to one embodiment of the present invention, a time-interleaved analog-to-digital converter device is disclosed, wherein the time-interleaved analog-to-digital converter device comprises a random number generator, a plurality of ADCs and an output circuit. The random number generator is configured to generate a random number sequence. The plurality of ADCs are configured to receive an analog input signal to generate a plurality of digital signals, respectively, and each ADC is further configured to generate a selection signal according to the random number sequence. The output circuit is configured to select one of the digital signals according to the selection signals generated by the ADCs, to generate a digital output signal.

According to another embodiment of the present invention, a control method of a time-interleaved analog-to-digital converter device is disclosed. The control method comprises the steps of: generating a random number sequence; using a plurality of ADCs, to receive an analog input signal to generate a plurality of digital signals, respectively; using each ADC to generate a selection signal according to the random number sequence; and selecting one of the digital signals of the ADCs according to the selection signals generated by the ADCs, to generate a digital output signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
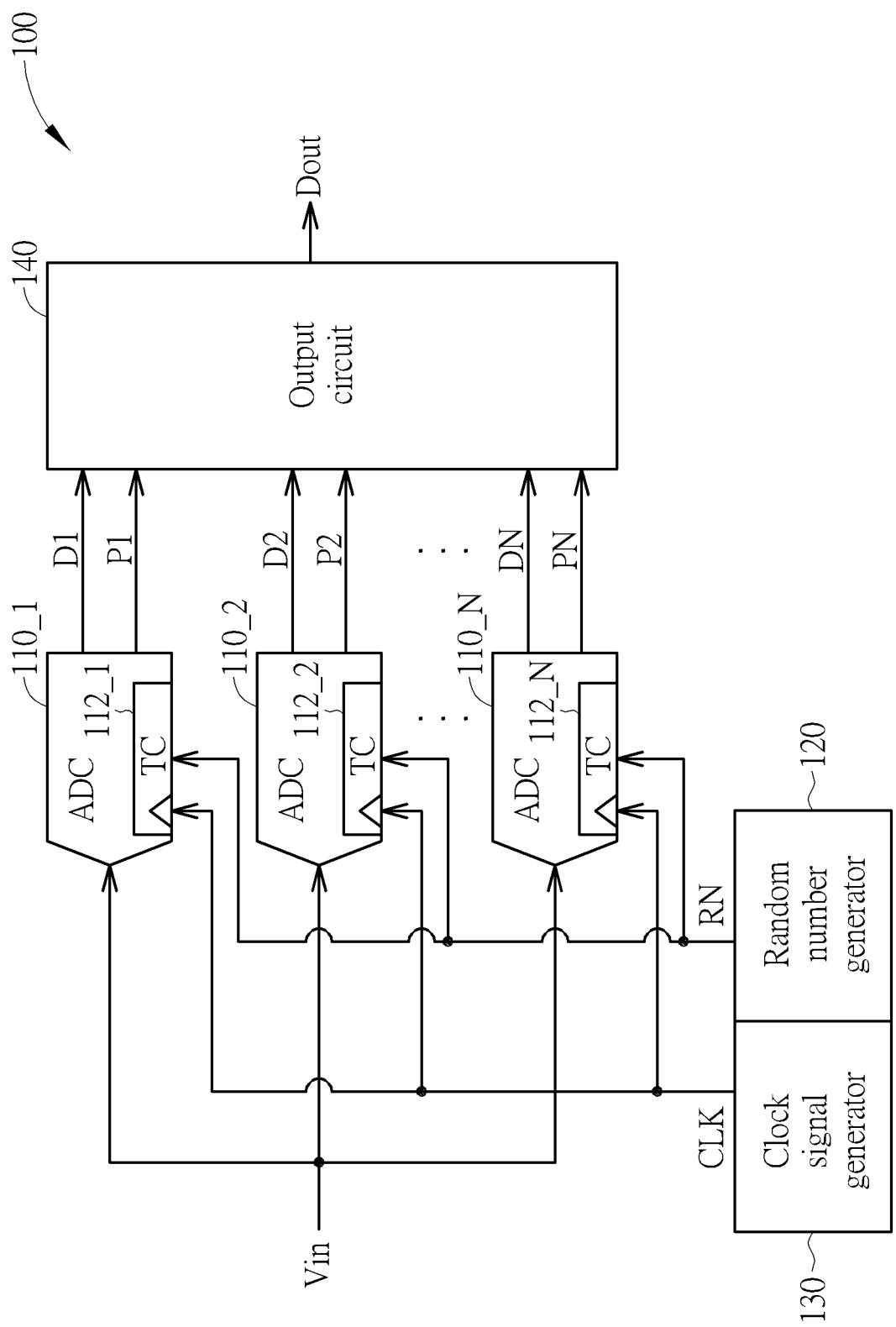
FIG. 1 is a diagram illustrating a time-interleaved analog-to-digital converter device according to one embodiment of the present invention.

FIG. 1 is a diagram illustrating a time-interleaved analog-to-digital converter device 100 according to one embodiment of the present invention. As shown in FIG. 1, the time-interleaved analog-to-digital converter device 100 comprises a plurality of ADCs 110_1-110_N, a random number generator 120, a clock signal generator 130 and an output circuit 140, where the ADCs 110_1-110_N comprise timing controllers (TCs) 112_1-112_N, respectively.

In the operations of the time-interleaved analog-to-digital converter device 100, the clock signal generator 130 generates a clock signal CLK to the ADCs 110_1-110_N, for the ADCs 110_1-110_N to receive an analog input signal Vin to generate a plurality of digital signals D1-DN, respectively. In this embodiment, the clock signal CLK may be a fastest clock signal within the system comprising the time-interleaved analog-to-digital converter device 100. Meanwhile, the random number generator 120 generates a random number sequence RN to the timing controllers 112_1-112_N, and the timing controllers 112_1-112_N refer to the random number sequence RN to generate selection signals P1-PN, respectively. In this embodiment, only one of the selection signals P1-PN has an enablement state at a same time, and the output circuit 140 selects the digital signal generated by the ADC whose selection signal has the enablement state, to generate a digital output signal Dout. For example, if the selection signal P2 has the enablement state and other selection signals P1 and P3-PN do not have the enablement state, the output circuit 140 can directly use the digital signal D2 as the digital output signal Dout, or the output circuit 140 processes the digital signal D2 to generate the digital output signal Dout.

In this embodiment, the timing controllers 112_1-112_M may have the similar circuit structure, and the each timing controller 112_1-112_M decodes the same random number sequence RN to determine if generating the selection signal having the enablement state. For example, referring to FIG. 2 and assuming that the random number sequence RN sequentially comprises random numbers (random bits) B0, B1, B2, B3, . . . , firstly, each timing controllers 112_1-112_M refers to a value of the first random number B0 (e.g. "0" or "1") to determine which one of the ADCs 110_1-110_N should be used for generating the digital output signal Dout. In the example shown in FIG. 2, the ADC 110_1 is selected, and the timing controller 112_1 generates the selection signal P1 having the enablement state (e.g. high voltage level, logical value "1"), and the output circuit 140 refers to the selection signal P1 to generate the digital output signal Dout based on the digital signal D1 outputted by the ADC 110_1; meanwhile, all of the selection signals P2-PN do not have the enablement state (e.g. low voltage level, logical value "0"), that is the digital signals D2-DN are not used for the output circuit 140 to generate the digital output signal Dout. Then, each timing controllers 112_1-112_M refers to a value the second random number B1 (e.g. "0" or "1") to determine which one of the ADCs 110_1-110_N should be used for generating the digital output signal Dout in the next cycle. In the example shown in FIG. 2, the ADC 110_3 is selected, and the timing controller 112_3 generates the selection signal P3 having the enablement state, and the output circuit 140 refers to the selection signal P3 to generate the digital output signal Dout based on the digital signal D3 outputted by the ADC 110_3; meanwhile, all of the selection signals P1, P2 and P4-PN do not have the enablement state, that is the digital signals D1, D2 and D4-DN are not used for the output circuit 140 to generate the digital output signal Dout. Then, each timing controllers 112_1-112_M refers to a value the third random number B2 (e.g. "0" or "1") to determine which one of the ADCs 110_1-110_N should be used for generating the digital output signal Dout in the next cycle. In the example shown in FIG. 2, the ADC 110_2 is selected, and the timing controller 112_2 generates the selection signal P2 having the enablement state, and the output circuit 140 refers to the selection signal P2 to generate the digital output signal Dout based on the digital signal D2 outputted by the ADC 110_2; meanwhile, all of the selection signals P1 and P3-PN do not have the enablement state, that is the digital signals D1 and D3-DN are not used for the output circuit 140 to generate the digital output signal Dout. Similar to the above steps, for every random number, one of digital signals D1-DN respectively generated by the ADCs 110_1-110_N is selected for the output circuit 140 to generate the digital output signal Dout.

In addition, because each of the ADCs 110_1-110_N needs a stability time (e.g. several cycles of the clock signal CLK) to generate the reliable digital signal D1-DN, respectively, the timing controller 112_1-112_N have a mechanism to avoid using the same ADC within the stability time. For example, assuming that the stability time is four cycles of the clock signal CLK, once the ADC 110_1 is selected while receiving the first random number B0, the ADC 110_1 cannot be selected while receiving the random numbers B2-B4. In addition, in order to improve the spur of the digital output signal Dout more effectively and to improve a spurious free dynamic range (SFDR), the number of the ADCs 110_1-110_N can be designed to be greater than the cycles of the clock signal CLK corresponding to the stability time. For example, if the stability time is four cycles of the clock signal CLK, the number of the ADCs 110_1-110_N may be five, six, seven or eight (i.e. N=5, 6, 7 or 8).

Figure 2:
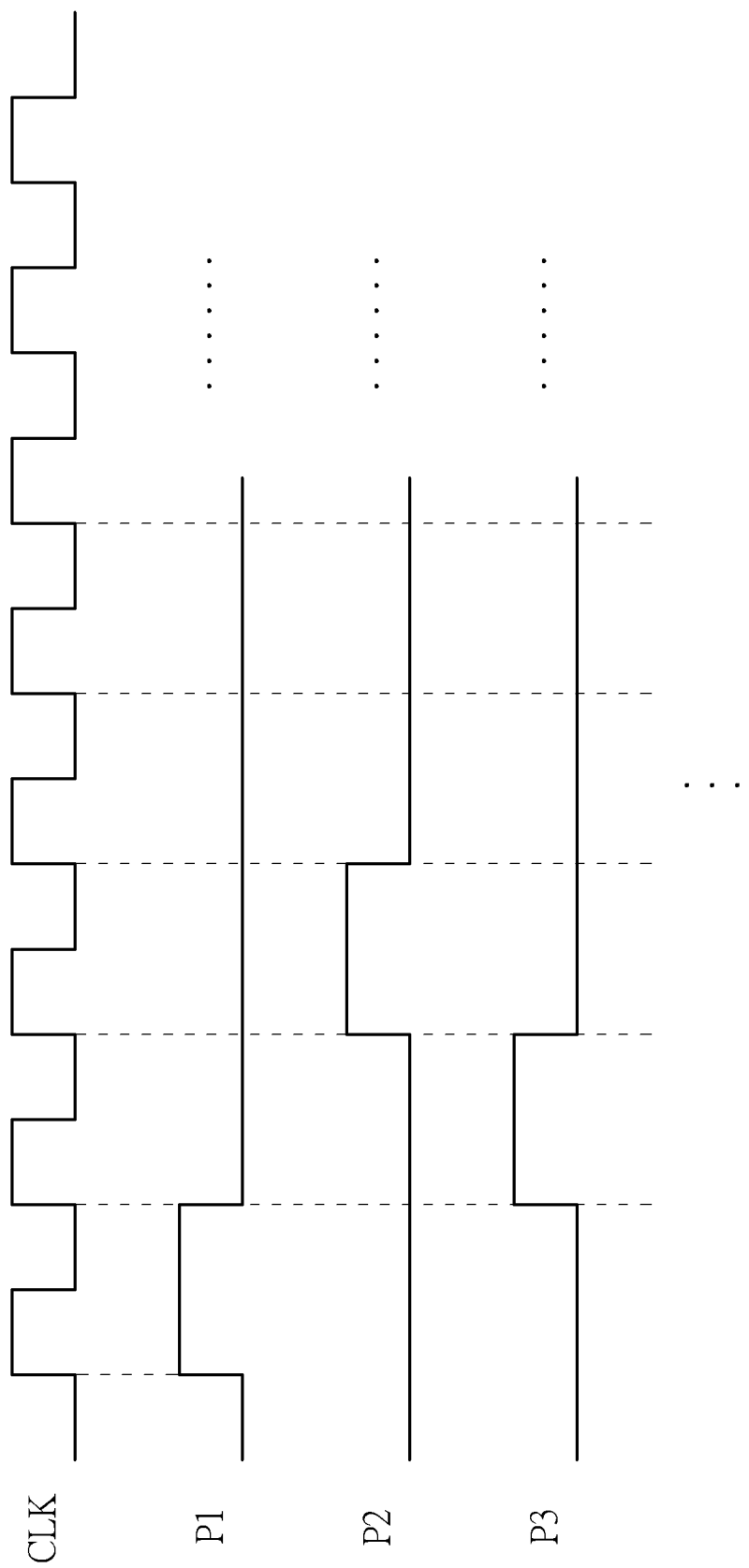
FIG. 2 shows a timing diagram of the clock signal and selection signals.

In the embodiment shown in FIG. 1 and FIG. 2, because the mechanism for selecting the ADCs 110_1-110_N is based on the internal timing controller 112_1-112_N of the ADCs 110_1-110_N, and only the random number sequence RN and the clock signal CLK are required to generate the selection signals P1-PN, the wires between the ADCs 110_1-110_N and the random number generator 120 and the clock signal generator 130 can be effectively reduced, to simplify the routing of the chip. In one embodiment, the random number generator 120 outputs the random number sequence RN via one or several wire(s), and a number of the wire(s) is less than the number of the ADCs 110_1-110_N. In detail, assuming that the number of the ADCs 110_1-110_N is five (i.e., N=5), the conventional art needs to control/select the ADCs 110_1-110_5 by using five different control signals via five different wires, but the embodiment shown in FIG. 1 and FIG. 2 can achieve the same purpose by using the wires whole number is less than five, and actually only one wire is enough for the transmission of the random number sequence. Therefore, the embodiment indeed has simple routing design of the chip.

Figure 3:
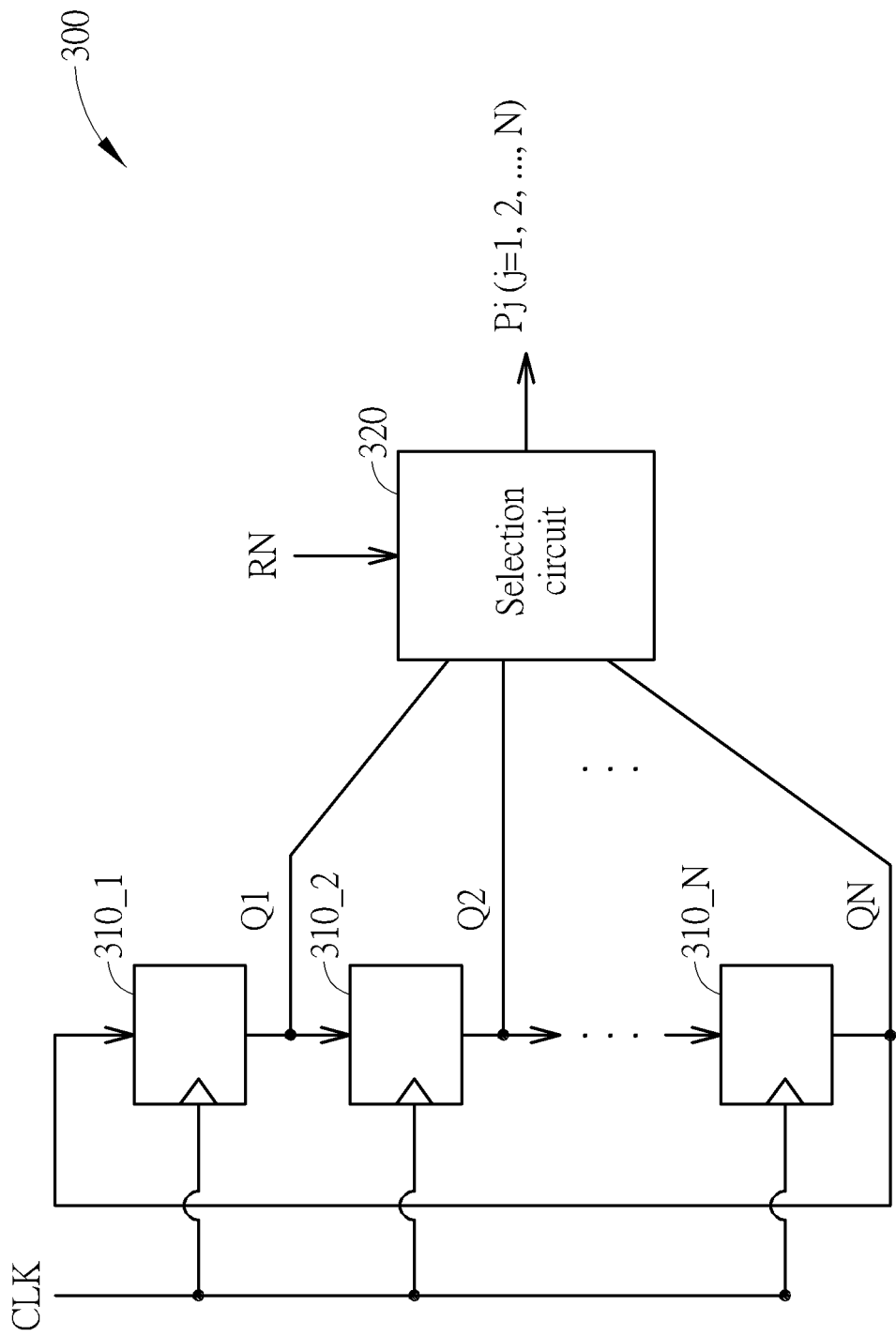
FIG. 3 is a diagram illustrating a timing controller according to one embodiment of the present invention

FIG. 3 is a diagram illustrating a timing controller 300 according to one embodiment of the present invention, wherein the timing controller 300 may be each one of the timing controllers 112_1-112_N shown in FIG. 1. As shown in FIG. 1, the timing controller 300 comprises a plurality of delay elements (in the embodiment, flip-flops 310_1-310_N) and a selection circuit 320. In this embodiment, the flip-flops 310_1-310_N are connected in series and controlled by the clock signal CLK, and the output signal of the last flip-flop 310_N is inputted to the first flip-flop 310_1. The flip-flops 310_1-310_N are configured to generate output signals Q1-QN, respectively, and the selection circuit 320 refers to the random number sequence RN to select one of the output signals Q1-QN to generate the selection signal Pj (j=1, 2, 3, 4 or 5).

Figure 4:
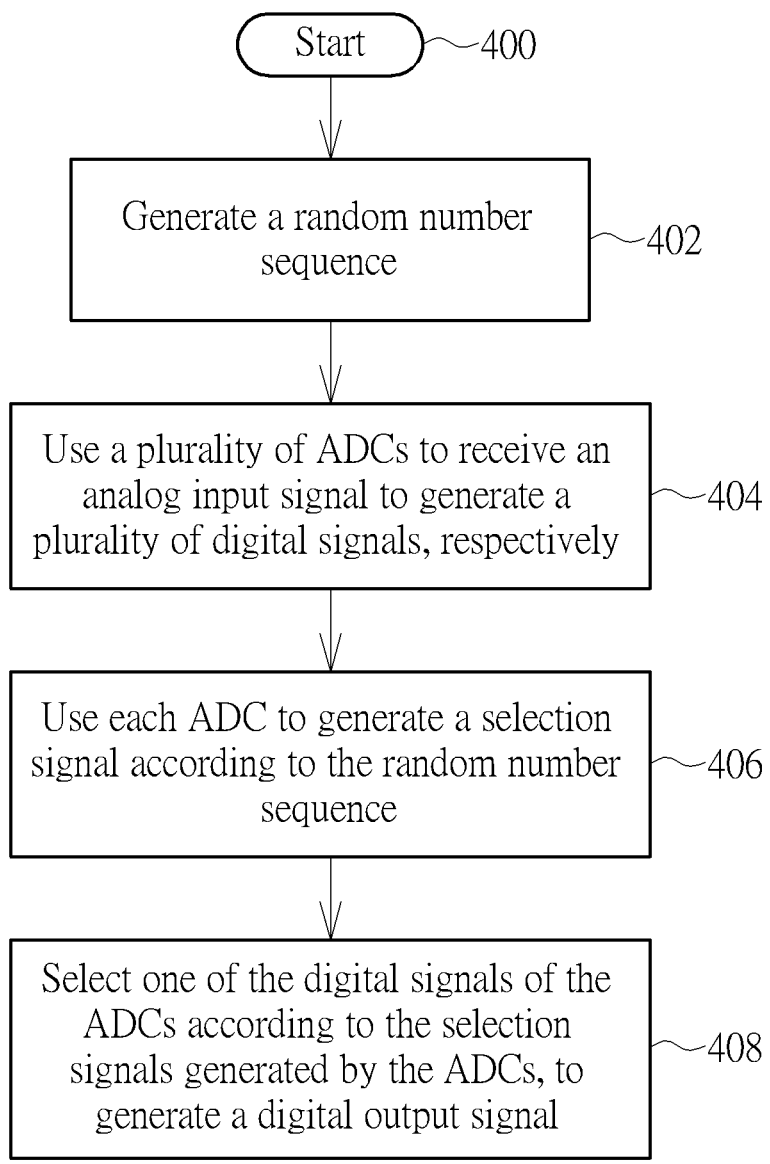
FIG. 4 is a flowchart of a control method of a time-interleaved analog-to-digital converter device according to one embodiment of the present invention.

FIG. 4 is a flowchart of a control method of a time-interleaved analog-to-digital converter device according to one embodiment of the present invention. Referring to the above embodiment, the flow of the control method is described as follows.

Step 400: the flow starts.

Step 402: generate a random number sequence.

Step 404: use a plurality of ADCs to receive an analog input signal to generate a plurality of digital signals, respectively.

Step 406: use each ADC to generate a selection signal according to the random number sequence.

Step 408: select one of the digital signals of the ADCs according to the selection signals generated by the ADCs, to generate a digital output signal.

Briefly summarized, in the present invention, by designing the distributed timing controller in the ADCs to receive the random number sequence to generate the selection signal, for the output circuit to select one of the digital signals respectively generated by the ADCs, the wire design between the ADCs and the surrounding circuits can be effectively simplified.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A time-interleaved analog-to-digital converter device, comprising:
   a random number generator, configured to generate a random number sequence;
   a plurality of analog-to-digital converters (ADCs), coupled to the random number generator, configured to receive an analog input signal to generate a plurality of digital signals, respectively, wherein each ADC is further configured to generate a selection signal according to the random number sequence; and
   an output circuit, coupled to the plurality of ADCs, configured to select one of the digital signals according to the selection signals generated by the ADCs, to generate a digital output signal;

wherein only one of the selection signals respectively generated by the ADCs has an enablement state at a same time, and the output circuit selects the digital signal generated by the ADC whose selection signal has the enablement state.

2. The time-interleaved analog-to-digital converter device of claim 1, wherein if the selection signal generated by one of the ADCs has the enablement state while receiving a first random number of the random number sequence, the one of the ADCs generates the selection signal that does not have the enablement state while receiving a second random number immediately following the first random number.

3. The time-interleaved analog-to-digital converter device of claim 1, wherein each ADC decodes the same random number sequence to determine if generating the selection signal having the enablement state.

4. The time-interleaved analog-to-digital converter device of claim 3, further comprising:
a clock signal generator, configured to generate a clock signal;
wherein each ADC comprises a timing controller, and the timing controller receives the clock signal and the random number sequence to generate the selection signal.

5. The time-interleaved analog-to-digital converter device of claim 4, wherein the random number generator outputs the random number sequence via at wire(s), and a number of the wire(s) is less than a number of the ADCs.

6. The time-interleaved analog-to-digital converter device of claim 5, wherein the random number generator outputs the random number sequence via only one wire.

7. The time-interleaved analog-to-digital converter device of claim 4, wherein the timing controller of one of the ADCs comprises:
a plurality of delay elements connected in series;
a selection circuit, configured to select one of output signals of the plurality of delay elements according to the random number sequence to generate selection signal.

8. The time-interleaved analog-to-digital converter device of claim 7, wherein each of the delay elements is a flip-flop, and the delay elements are controller by the clock signal.

9. A control method of a time-interleaved analog-to-digital converter device, comprising:
generating a random number sequence;
using a plurality of analog-to-digital converters (ADCs), to receive an analog input signal to generate a plurality of digital signals, respectively;
using each ADC to generate a selection signal according to the random number sequence; and
selecting one of the digital signals of the ADCs according to the selection signals generated by the ADCs, to generate a digital output signal;
wherein only one of the selection signals respectively generated by the ADCs has an enablement state at a same time, and the step of selecting the one of the digital signals of the ADCs according to the selection signals generated by the ADCs, to generate the digital output signal comprises:
selecting the digital signal generated by the ADC whose selection signal has the enablement state.

10. The control method of claim 9, further comprising:
if the selection signal generated by one of the ADCs has the enablement state while receiving a first random number of the random number sequence, using the one of the ADCs to generate the selection signal that does not have the enablement state while receiving a second random number immediately following the first random number.

* * * * *